(12) United States Patent
Subramoniam et al.

(10) Patent No.: US 7,224,756 B2
(45) Date of Patent: May 29, 2007

(54) METHOD AND SYSTEM FOR PROVIDING A CODEC CLOCK SIGNAL AT A DESIRED OPERATIONAL RATE

(75) Inventors: Krishnan Subramoniam, Austin, TX (US); Jens Puchert, Austin, TX (US); Anand Venkitachalam, Pune (IN); Brian K. Straup, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 870 days.

(21) Appl. No.: 10/144,295

(22) Filed: May 13, 2002

(65) Prior Publication Data
US 2003/0026368 A1 Feb. 6, 2003

Related U.S. Application Data

(60) Provisional application No. 60/309,421, filed on Aug. 1, 2001.

(51) Int. Cl.
*H04L 27/08* (2006.01)

(52) U.S. Cl. ............... 375/345; 370/352; 345/211; 713/324; 713/503

(58) Field of Classification Search ........... 375/354; 327/198; 345/211; 370/352; 713/324, 503
See application file for complete search history.

(56) References Cited

U.S. PATENT DOCUMENTS

| | | | | |
|---|---|---|---|---|
| 5,512,938 A | * | 4/1996 | Ohno | 348/14.1 |
| 6,347,380 B1 | * | 2/2002 | Chang et al. | 713/503 |
| 6,980,056 B1 | * | 12/2005 | Alexander et al. | 330/284 |
| 7,003,682 B2 | * | 2/2006 | Irazabal et al. | 713/324 |
| 2002/0172189 A1 | * | 11/2002 | Lazarus et al. | 370/352 |
| 2003/0016066 A1 | * | 1/2003 | Irazabal et al. | 327/198 |
| 2003/0025689 A1 | * | 2/2003 | Kim | 345/211 |

* cited by examiner

*Primary Examiner*—Chieh M. Fan
*Assistant Examiner*—Eva Zheng
(74) *Attorney, Agent, or Firm*—Steven Lin, Esq.

(57) ABSTRACT

A clock generator system and method for providing and operating a codes with a clock signal at a desired operational rate are disclosed. The clock generator system also has a phase-locked loop circuit. The clock generator system determines whether an available clock signal within a circuit environment of the codec has a desired clock rate. If the available clock signal has the desired clock rate, the clock generator system supplies and operates the codec with the available clock signal. If the available clock signal does not have the desired clock rate, the phase-locked loop circuit generates from the available clock signal a desired clock signal having the desired clock rate and supplies and operates the codec with the desired clock signal.

25 Claims, 8 Drawing Sheets

| CLOCK PRESENT SIGNAL 207 | VALUE FOR ID1# PIN 155 | VALUE FOR ID0# PIN 154 | OPERATIONAL MODE | CODEC ID | CLOCK SOURCE | CLOCK RATE (MHZ) | PLL 221 ACTIVE ? | CLOCK CONNECTIONS |
|---|---|---|---|---|---|---|---|---|
| 1 | 1 | 1 | PRIMARY | 0 | OSC | 24.576 | NO | CLOCK GENERATOR OSC. DRIVING XTL_IN PIN 140 |
| 1 | 1 | 0 | PRIMARY | 0 | OSC | 14.31818 | YES | EXT. CLOCK SOURCE DRIVES XTL_IN PIN 140 & LOOP FILTER 306 CONNECTED TO XTL_OUT PIN 142 |
| 1 | 0 | 1 | PRIMARY | 0 | OSC | 27 | YES | " |
| 1 | 0 | 0 | PRIMARY | 0 | OSC | 48 | YES | " |
| 0 | 1 | 1 | PRIMARY | 0 | XTAL | 24.576 | NO | CRYSTAL. CONNECTED TO PINS 140 AND 142 |
| 0 | 1 | 0 | SECONDARY | 1 | BIT_CLK SIGNAL (AT PIN 146) | 12.288 | NO | BIT_CLK SIGNAL FROM PRIMARY CODEC DRIVING PIN 146 ON SECONDARY CODECS |
| 0 | 0 | 1 | SECONDARY | 2 | BIT_CLK SIGNAL (AT PIN 146) | 12.288 | NO | " |
| 0 | 0 | 0 | SECONDARY | 3 | BIT_CLK SIGNAL (AT PIN 146) | 12.288 | NO | " |

FIGURE 5

| CLOCK SOURCE FOR PIN 140 | CLOCK RATE (MHz) FOR CLOCK SOURCE | VALUE FOR M DIVIDER 302 | VALUE FOR N DIVIDER 312 | FREQUENCY (kHz) FOR PHASE DETECTOR 304 | OUTPUT CLOCK RATE (MHz) FOR PLL 221 |
|---|---|---|---|---|---|
| PC SYSTEM CLOCK | 14.31818 | 201 | 345 | 71.2 | 24.576 |
| VIDEO CLOCK | 27 | 401 | 365 | 67.3 | 24.576 |
| PCI BUS CLOCK | 33 | 474 | 353 | 69.6 | 24.576 |
| USB CLOCK | 48 | 625 | 320 | 76.8 | 24.576 |

METHOD AND SYSTEM FOR PROVIDING A CODEC CLOCK SIGNAL AT A DESIRED OPERATIONAL RATE

RELATED APPLICATION

The present application claims the benefit of U.S. provisional application No. 60/309,421 filed by inventors Krishnan Subramoniam, Jens Puchert, Anand Venkitachalam, Brian K. Straup, and John L. Melanson on Aug. 1, 2001 entitled "PLL Frequency Detection Scheme for AC 97 Codecs".

BACKGROUND OF THE INVENTION

1. Field of the Invention

The present invention relates to a coder/decoder ("codec"), and, more particularly, to providing and operating a codes with a clock signal at a desired operational rate. More specifically, the present invention relates to generating a desired clock signal at the desired operational rate from an available external clock signal at another clock rate.

2. Description of Related Art

A (coder/decoder) ("codec") is considered to be any technology that encodes and decodes data. The encoding and decoding of data is useful and important to the processing of data in analog, digital, and mixed signal systems. Codecs may be implemented in software, hardware, or a combination of both software and hardware. Also, an exemplary type of audio codec is the audio codec ("AC") '97, which Intel Corporation has published in various revisions of the specification entitled *Audio Codec '97* ("AC '97") (e.g., revision 2.2 in September 2000; revision 2.1 in May 22, 1998; revision 2.0 in Sep. 29, 1997; revision 1.03 in Sep. 15, 1996). The AC '97 specification and its various revisions are hereby incorporated by reference.

The AC '97 specification, revision 1.03 comprehensively defines a serial codec device that is designed to be used in systems in which audio signal processing and audio analog-to-digital (A/D) and digital-to-analog (D/A) conversions are performed in separate devices. The AC '97 specification, revision 2.0 is a follow-up revision to revision 1.03 and further defines the interface for a combined audio/telephony codec. Revision 2.0 also includes definitions for modem sample rate control, tagged data exchange using different sampling rates, general purpose input/output definitions, and extended AC-link definitions for multiple devices and power management event handling. Revision 2.1 updates revisions 1.03 and 2.0 by including some electrical and power management updates. Revision 2.2 provides further updates to revision 2.1 by adding optional S/PDIF support, standardized slot re-mapping, and updated electrical specification for better riser support.

Codecs require the use of a clock signal at an operational codec clock rate. A separate clock generating oscillator or crystal is typically utilized to provide the clock signal at the operational codec clock rate. However, the use of a separate clock generating oscillator or crystal requires an additional component to the overall codec system or chip. A separate clock generating oscillator or crystal adds to the cost of the codec (e.g., a crystal is a relatively expensive component). Furthermore, the use of an additional component, such as the separate clock, adds to the space requirement of the codec hardware. Although the desire and need is to eliminate the use of a separate clock for a codec, the use of any extra pins or additional memory requirements to implement other clocking schemes for the codec chip also needs to be minimized or eliminated.

The present invention recognizes the desire and need for eliminating the use of a separate clock, such as a clock generating oscillator or a crystal, for a codec, which would reduce the overall size and cost for the codec. In implementing a different clocking scheme, the present invention further recognizes the desire and need to minimize or reduce having to add any extra pins or additional memory to the codec chip. The present invention overcomes the problems and disadvantages that have been encountered with the prior art.

SUMMARY OF THE INVENTION

A clock generator system and method for providing and operating a codec with a clock signal at a desired operational rate are disclosed. The clock generator system has a desired clock-rate processing circuit and a clock-rate switching system coupled together in series and an output of the clock-rate switching system coupled to inputs of both an analog clock generator and a digital clock generator and an output of the digital clock generator coupled to a codec. The clock generator system also has a phase-locked loop circuit.

The clock generator system determines whether an available clock signal within a circuit environment of the codec has a desired clock rate. If the available clock signal has the desired clock rate, the clock generator system supplies and operates the codec with the available clock signal. If the available clock signal does not have the desired clock rate, the phase-locked loop circuit generates from the available clock signal a desired clock signal having the desired clock rate and supplies and operates the codec with the desired clock signal.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIG. 5 is a table showing exemplary combinatorial values assigned according to the present invention for a clock present signal, an identification pin, and another identification pin for defining which mode the codec operates and which clock source drives the codec;

FIG. 6 is a table showing exemplary external clock sources and the values assigned to the M and N dividers of the phase-locked loop circuit that are used to generate from the available clock signal the desired clock signal with the desired clock rate;

DETAILED DESCRIPTION OF THE INVENTION

The present invention is a clock generator system and method for providing and operating a codec with a clock signal at a desired operational rate. The following specification discloses the implementation of the present invention in terms of an exemplary audio codec according to the AC '97 codec specification or standard. As stated earlier, the AC '97 specification is a published and well-known standard, and the AC '97 specification and its various revisions are hereby incorporated by reference. However, even though the present invention is disclosed in terms of implementation in an exemplary audio codec according to the AC '97 specification, the present system and method are not in any way limited to just being utilized in a particular audio codec but may be implemented in any type of or suitable codec (including video codecs).

Figure 1:
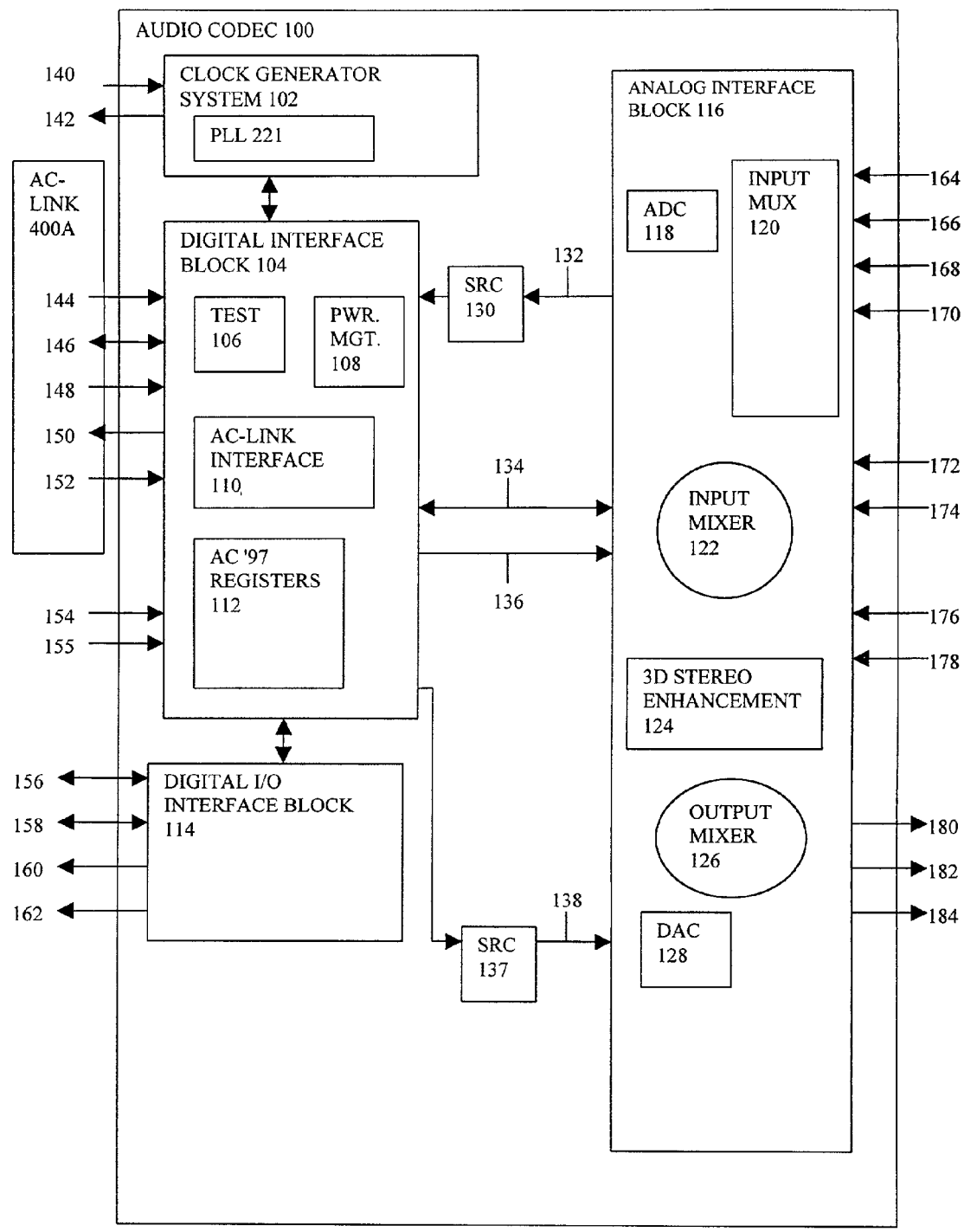
FIG. 1 is an exemplary block diagram of a codec that implements a clock generator system according to the present invention.

With reference now to FIG. 1, an exemplary audio codec 100 according to the AC '97 specification is shown. Audio codec 100 has a clock generator system 102 according to the present invention. Clock generator system 102 contains a phase-locked loop ("PLL") circuit 221. PLL circuit 221 generates a desired clock signal with a desired clock rate from an available clock source (that is not at the desired clock rate), such as an external clock source (e.g., including but not limited to a personal computer ("PC") system clock, a video clock, a peripheral component interconnect ("PCI") bus clock, or an universal serial bus ("USB") bus clock) within a circuit environment of audio codec 100. Audio codec 100 has a crystal input ("XTL_IN") pin 140 and a crystal output ("XTL_OUT") pin 142. Clock generator system 102 interfaces and communicates with XTL_IN and XTL_OUT pins 140 and 142. XTL_IN pin 140 accepts either a clock generator oscillator, such as an external CMOS clock, or a crystal as the clock source for driving and operating audio codec 100. If a crystal drives audio codec 100, then the crystal is coupled between XTL_IN pin 140 and XTL_OUT pin 142. However, if a clock generator oscillator drives audio codec 100, then clock generator oscillator drives XTL_IN pin 140. In this case, XTL_OUT pin 142 is not connected to any component or device and is left floating.

Figure 4A:
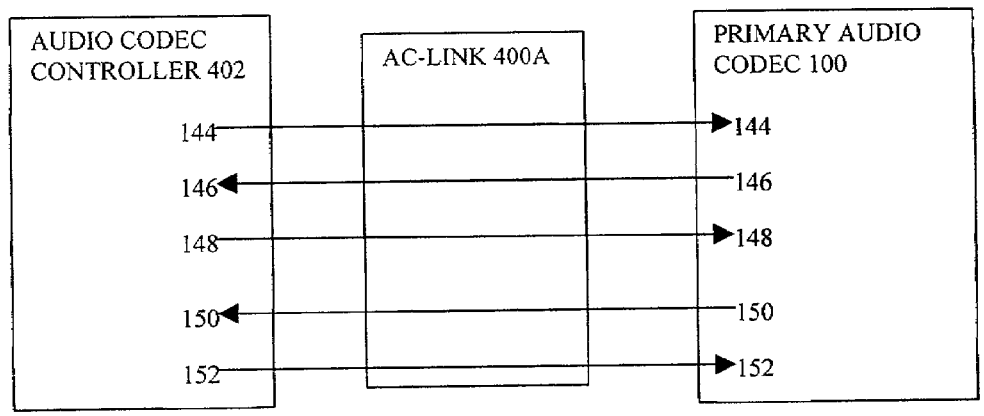
FIG. 4A is an exemplary block diagram of a single codec of FIG. 1 configured to operate in a primary or master mode and linked to a controller.
Figure 4B:
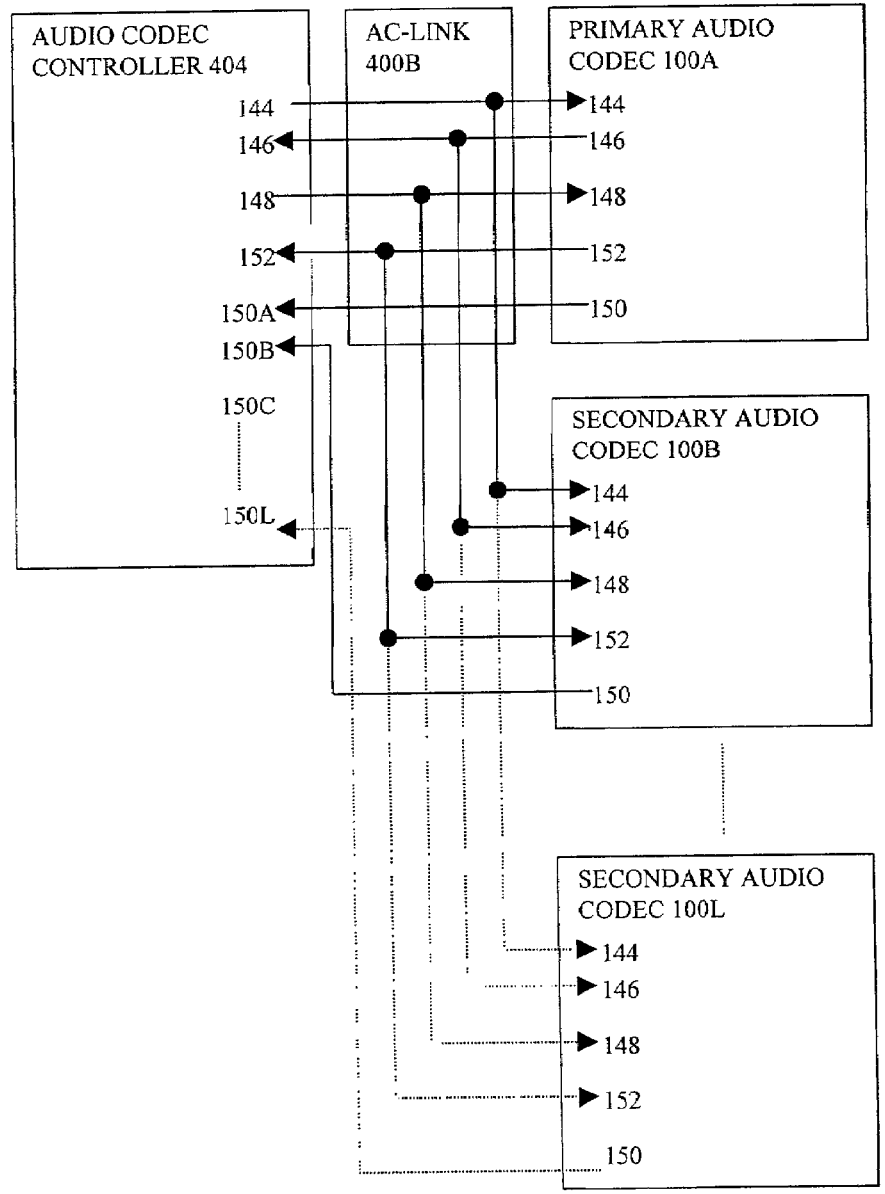
FIG. 4B is another exemplary block diagram of multiple codecs of FIG. 1 in which one of the codecs is configured to operate in a primary or master mode and the other codecs are configured to operate in the secondary or slave modes and in which the multiple codecs are linked to a controller.

Clock generator system 102 is coupled to a digital interface block 104. Digital interface block 104 contains a test block 106 that provides the specific device test functions for design verification and debug of audio codec 100 into a silicon design. Test block 106 also provides the test circuitry required for production testing and manufacturing stages of audio codec 100. Digital interface block 104 also has a power management control block 108 utilized for managing power usage by audio codec 100. Digital interface block 104 also includes an audio codec link ("AC-link") interface block 110 and an AC '97 registers block 112. AC '97 registers block 112 contains various registers defined by the AC '97 specification and standard. AC-link interface block 110 couples to an AC-link 400A. AC-link 400A is a point-to-point link between audio codec 100 and audio codec controller 402 or 404 as shown in FIGS. 4A and 4B. Audio codec controller 402 or 404 controls operations of audio codec 100.

AC-link 400A includes a serial port sync pulse input ("SYNC") pin 144, a serial port master clock input/output ("BIT_CLK") pin 146, a serial data input stream to audio codec input ("SDATA_OUT") pin 148, a serial data output stream to audio codec output ("SDATA_IN") pin 150, and a reset input ("RESET#") pin 152. SYNC pin 144 provides the serial port timing signal for audio codec 100. BIT_CLK pin 146 provides the input/output signal, which controls the master clock timing for AC-link 400A. SDATA_OUT pin 148 provides the input signal that is transmitted to control information and digital audio output streams which are sent to the digital-to-analog converters ("DACs") of DAC block 128. The data is clocked into audio codec 100 on the falling edge of the BIT_CLK signal. SDATA_IN pin 150 provides the output signal that transmits the status information and digital audio input streams from the analog-to-digital converters ("ADCs") of ADC block 118. The data is clocked from audio codec 100 on the rising edge of the BIT_CLK signal. RESET# pin 152 resets audio codec 100 before entering into the normal operational mode.

Figure 2:
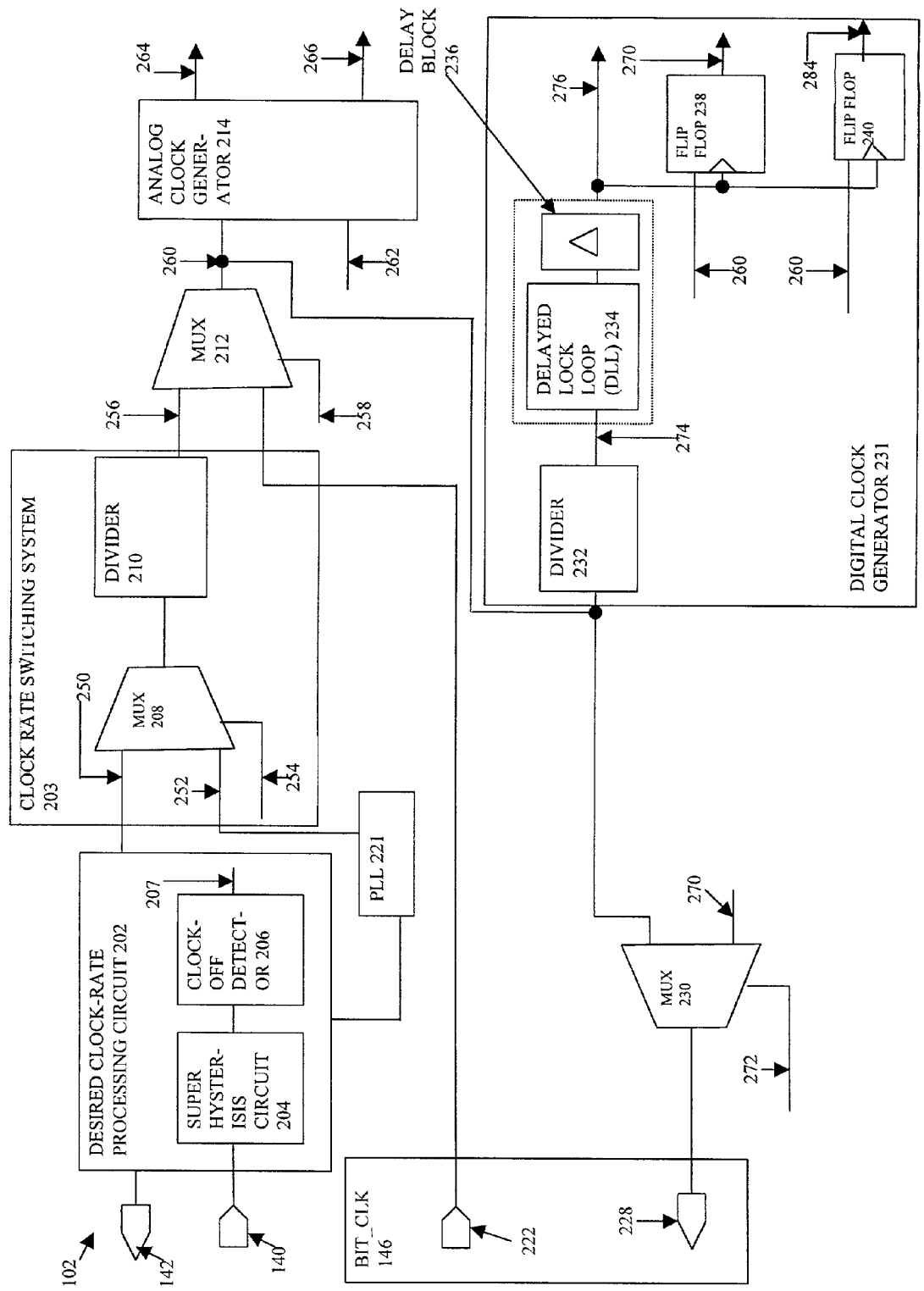
FIG. 2 is an exemplary block diagram of a clock generator system implemented in the codec of FIG. 1 according to the present invention that is shown in more detail.

Audio codec 100 also has an identification ("ID0#") pin 154 and another identification ("ID1#") pin 155, which interface with digital interface block 104. Values assigned to ID0# and ID1# pins 154 and 155 and a value assigned to a clock present signal 207 as shown in FIG. 2 are utilized to determine the mode of operation (e.g., primary/master mode or secondary/slave mode) of audio codec 100 and the clock source for providing the clock signal with the desired clock rate to audio codec 100.

Digital interface block 104 is coupled to a digital input/output ("I/O") interface block 114. Digital I/O interface block 114 digitally interfaces with input and output devices through I/O pins such as the following exemplary pins: a general purpose I/O or left-right clock I/O ("GPIO0/LRCLK") pin 156, a general purpose I/O or serial data output I/O ("GPIO1/SDOUT") pin 158, an external amplifier power down or serial clock output ("EAPD/SCLK") pin 160, and a Sony/Phillips Digital Interface Output or Serial Data Output 2 output ("SPDO/SDO2") pin 162.

GPIO0/LRCLK pin 156 is a general purpose I/O pin that is utilized to interface with external circuitry. GPIO0/LRCLK pin 156 also provides the left-right ("L/R") clock for both serial data ports under certain conditions. GPIO1/SDOUT pin 158 is another general purpose I/O pin that is also used to interface with external circuitry. GPIO1/SDOUT pin 158 also provides the serial data for the first serial data port under certain conditions. EAPD/SCLK pin 160 is used to control the power-down state of an external amplifier. EAPD/SCLK pin 160 also provides the serial clock for both serial data ports. SPDO/SDO2 pin 162 generates the digital output for the Sony/Phillips digital interface output ("S/PDIF") from audio codec 100 under certain conditions. SPDO/SDO2 pin 162 also provides the serial data for the second serial data port under certain conditions. Digital I/O interface block 114 is utilized to connect audio codec 100 to consumer electronic equipment and devices. Digital I/O interface block 114 contains a serial port that is utilized to interface audio codec 100 with one or two external stereo digital-to-analog converters ("DACs").

An analog interface block 116 is coupled to digital interface block 104. Analog interface block 116 operates at a fixed sample rate, such as 48 KHz. Gain and/or mute control signals 134 and mixer and/or multiplexer ("mux") select signals 136 are communicated between digital interface block 104 and analog interface block 116. Data 132 is transmitted from analog interface block 116 to digital interface block 104, and data 138 is transmitted from digital interface block 104 to analog interface block 116. The SRC system includes a sample rate converter ("SRC") 130 coupled in the data transmission path after the ADCs of ADC block 118 for providing the required sample rate from fixed sample rate of data 132 from the ADCs. The SRC system further includes another SRC 137 coupled in the data transmission path before the DACs of DAC block 128 for providing the data at 48 kHz rate 138 to the DACs.

Analog interface block 116 contains the analog circuitry for providing the audio functions of audio codec 100. Analog interface block 116 includes ADC block 118, an input multiplexer ("MUX") 120, an input mixer 122, a 3-D stereo enhancement block 124, an output mixer 126, and a DAC block 128. Analog interface block 116 is coupled to and interfaces with various pins such as the following exemplary pins: line input ("LINE") pins 164, compact disk ("CD") audio input pins 166, auxiliary ("AUX") input pins 168, video ("VIDEO") audio input pins 170, a primary microphone ("MIC1") pin 172, a secondary microphone ("MIC2") pin 174, a speakerphone input ("PHONE") input pin 176, a personal computer beep speaker input ("PC_BEEP") pin 178, line level output ("LINE_OUT") pins 180, headphone output ("HP_OUT") pins 182, and a speakerphone output ("MONO_OUT") pin 184.

LINE pins 164 receive analog inputs, which provide a pair or stereophonic sources to analog input mixer 122 and may be used for an auxiliary external audio source. CD audio input pins 166 receive analog inputs that also provide a pair or stereophonic sources to analog input mixer 122 and may be used for a CD audio source. AUX input pins 168 receive analog inputs that are a pair or stereophonic sources to analog input mixer 122 and may be used for an auxiliary internal or external audio source. VIDEO audio input pins 170 receive analog inputs that are a pair or stereophonic sources to analog input mixer 122 and may be used for the audio signal output of a video device.

MIC1 pin 172 receives an analog input that is a monophonic source to analog input mixer 122 and may be used for a desktop microphone. MIC2 pin 174 receives an analog input that is a monophonic source to analog input mixer 122 and may be used for a headset or alternate microphone. PHONE pin 176 receives an analog input that is a monophonic source to analog input mixer 122 and may be used for the audio signal output of a telephony device. PC_BEEP pin 178 receives the analog input that is intended to pass the Power On Self-Test ("POST") tones of a personal computer to the audio subsystem. LINE_OUT pins 180 provides the analog line output signals from stereo output mixer 126. HP_OUT pins 182 outputs the analog headphone output signals from stereo output mixer 126. MONO_OUT pin 184 provides the analog output signal from the stereo-to-mono mixer 126.

Referring now to FIG. 2, exemplary clock generator system 102 implemented in audio codes 100 of FIG. 1 according to the present invention is shown in more detail. Clock generator system 102 has a desired clock-rate processing circuit 202 and a clock-rate switching system 203 coupled together in series. PLL circuit 221 is coupled in a feedback loop between desired clock-rate processing circuit 202 and clock-rate switching system 203. XTL_IN pin 140 and XTL_OUT pin 142 are coupled to and interface with desired clock-rate processing circuit 202. Desired clock-rate processing circuit 202 has at least a super hysterisis circuit 204 and a clock-off detector 206 coupled together in series. Super hysterisis circuit 204 is coupled to XTL_IN pin 140, and clock-off detector 206 outputs clock present signal 207, which is one of the signals utilized to determine the mode of operation (e.g., master or slave mode) for audio codec 100 and which clock source is used to drive audio codec 100 when audio codec 100 is operating in the master mode.

Clock-rate switching system 203 includes a multiplexer ("MUX") 208 coupled in series with a divider 210. MUX 208 receives a determined clock output signal 250 from desired clock-rate processing circuit 202. A PLL control signal 254 is asserted on MUX 208 when the available clock signal within the circuit environment of audio codec 100 does not have the desired clock rate. When PLL control signal 254 is asserted, MUX 208 outputs a voltage control output signal 252 that activates the use of PLL circuit 221 to generate a desired clock signal at a desired clock rate from the available clock signal. Divider 210 outputs a selected clock signal 256 to a mode switching system. Mode switching system has an analog mode switching multiplexer ("MUX") 212 and a digital mode switching multiplexer ("MUX") 230. Analog mode switching MUX 212 also receives a BIT_CLK input signal 222 from BIT_CLK pin 146 and a slave signal 258 that is asserted when audio codec 100 is to be operated in the slave mode with the respective slave-mode clock signal (e.g., BIT_CLK signal at the BIT_CLK rate).

Analog mode switching MUX 212 outputs a clock generating signal 260. Digital mode switching MUX 230 receives clock generating signal 260 from analog mode switching MUX 212 and also separately receives a digital clock signal 270. A BIT_CLK output signal 228 from digital mode switching MUX 230 is provided to drive the BIT_CLK pin 146 when audio codec 100 is in the master mode. Based on the status of chip power down signal 272, either clock signal 260 or clock signal 270 drives mux 230.

Also, analog clock generator 214 receives clock generating signal 260 and a clock synchronous input signal 262. Analog clock generator 214 generates a delayed analog clock output signal 264 and an analog clock output signal 266 based on clock generating signal 260. Digital clock generator 231 further receives clock generating signal 260. Digital clock generator 231 includes a divider 232, a delayed lock loop circuit ("DLL") 234, and a delay block 236 coupled together in series. Digital clock generator 231 outputs a digital clock output signal 276. Digital clock generator 231 further has two flip flops 238 and 240. Flip flop 238 receives digital clock output signal 276 and clock generating signal 260 to generate a converted digital clock output signal 270 that is sample rate converted relative to digital clock output signal 276. Flip flop 240 also receives digital clock output signal 276 and clock generating signal 260 to generate another converted digital clock output signal 284 that is synchronized relative to digital clock output signal 276.

Therefore, the operations of clock generator system 102 with PLL circuit 221 for providing the clock signal to drive audio codec 100 in the primary/master mode are summarily described as follows. Desired clock-rate processing circuit 202 determines whether an available clock signal within a circuit environment of audio codec 100 has a desired clock rate for driving audio codec 100. If the available clock signal has the desired clock rate, then clock-rate switching system 203 directs digital clock generator 231 to supply and operate audio codes 100 with the available clock signal. On the other hand, if the available clock signal does not have the desired clock rate, then PLL circuit 221 is activated, and PLL circuit 221 generates from the available clock signal a desired clock signal that has the desired clock rate. Digital clock generator 231 supplies and operates audio codec 100 with the desired clock signal.

Figure 3:
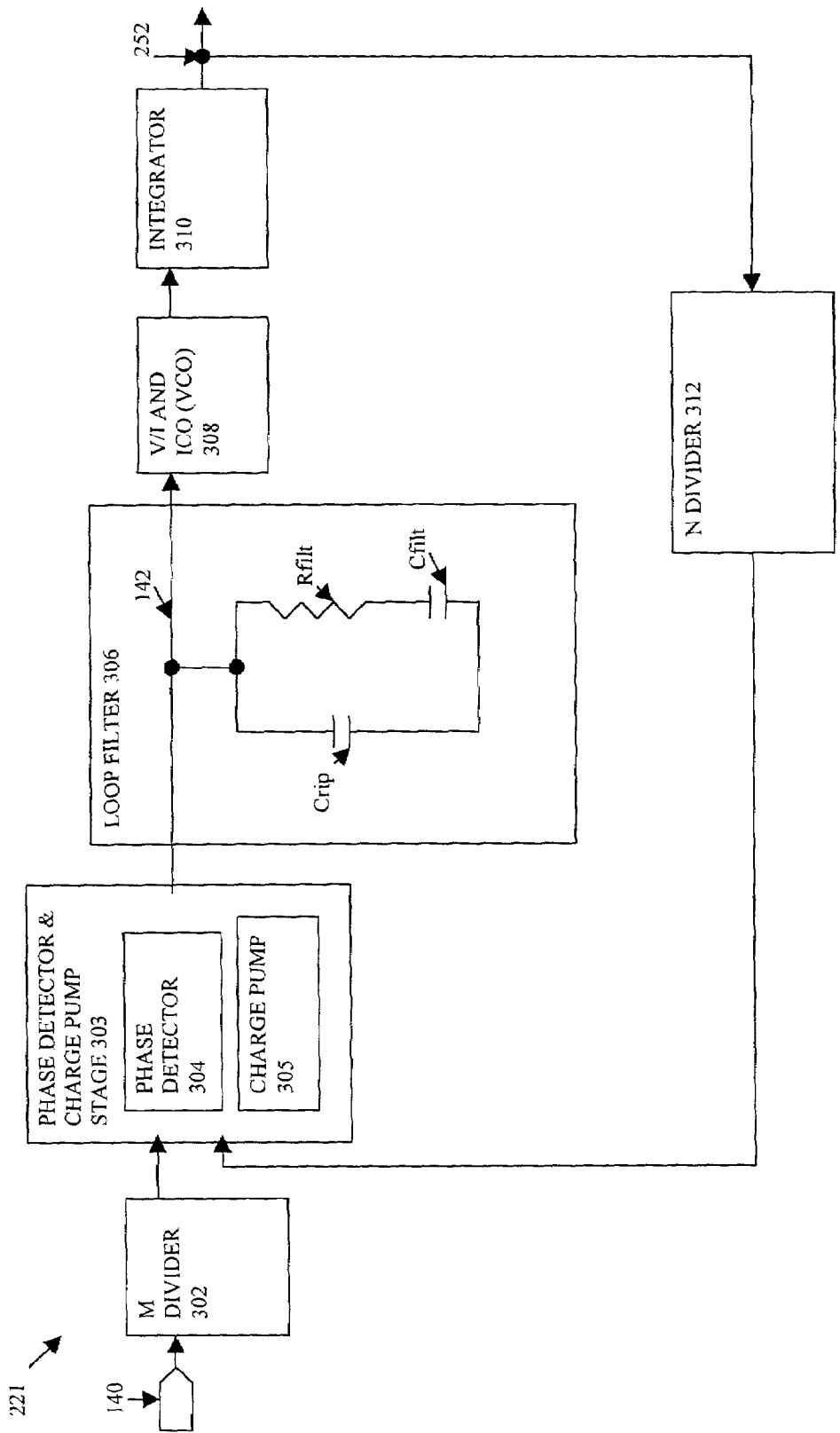
FIG. 3 is an exemplary block diagram of a phase-locked loop circuit that is shown in more detail and used in the clock generator system of FIG. 2.

With reference now to FIG. 3, PLL circuit 221 used in the clock generator system of FIG. 2 is shown in more detail. PLL circuit 221 includes an M divider 302, a phase detector and charge pump stage 303, a loop filter 306, a transconductance ("V/I") and current (or voltage) controlled oscillator ("ICO" or "VCO") stage 308, and an integrator 310 coupled together in series. An N divider 312 is coupled in a feedback loop between an output of integrator 310 and an input of phase detector and charge pump stage 303. Phase detector and charge pump stage 303 contains a phase detector 304 and a charge pump 305. Loop filter 306 includes a filter resistor Rfilt and a filter capacitor Cfilt coupled together in series and a rip capacitor Crip coupled in parallel to the series of both filter resistor Rfilt and filter capacitor Cfilt. XTL_IN pin 140 of audio codec 100 is coupled to the input of M divider 302. Loop filter 306 is coupled to XTL_OUT pin 142 of audio codec 100, and XTL_OUT pin 142 is fed into V/I and ICO/VCO stage 308. During configuration and before operation of audio codec 100, values of M divider 302 and N divider 312 are adjusted based on a rate of which of the available clock signals from various external clock sources is used to generate the desired clock rate. Exemplary available clock signals from various external clock sources and values for M and N dividers 302 and 312 will be discussed later in more detail (e.g., in FIGS. 5 and 6).

FIGS. 4A and 4B show configurations as to audio codec 100 being implemented in the primary and secondary modes. Referring now to FIG. 4A, a single audio codec 100 is configured in the primary or master mode and is linked to an audio codec controller 402 through an AC-link 400A. AC-link 400A is a point-to-point connection between audio codec controller 402 and primary audio codec 100. AC-link 400A connects together SYNC pins 144, BIT_CLK pins 146, SDATA_OUT pins 148, SDATA_IN pins 150, and RESET# pins 152 of audio codec controller 402 and primary audio codec 100. In the configuration of FIG. 4A, clock generator system 102 of primary audio codec 100 utilizes the available clock signal within the circuit environment of audio codec 100 to provide the clock signal with the desired clock rate to drive primary audio codec 100.

With reference now to FIG. 4B, multiple audio codecs 100A, 100B, . . . 100L are coupled to an audio codec controller 404 through an AC-link 400B. Audio codec 100A is configured to operate in a primary or master mode while audio codecs 100B . . . 100L are configured to operate in the secondary or slave modes. Primary audio codec 100A therefore drives slave audio codecs 100B . . . 100L. AC-link 400B is a point-to-point connection between audio codec controller 404 and primary audio codec 100A. AC-link 400B connects together SYNC pins 144, BIT_CLK pins 146, SDATA_OUT pins 148, and RESET# pins 152 of audio codec controller 404 and primary audio codec 100A. AC-link 400B further connects in a point-to-point manner SDATA_IN pin 150A of audio codec controller 404 and SDATA_IN pin 150 of primary audio codec 100A. Secondary audio codecs 100B . . . 100L are further coupled to AC-link 400B at the points which connect SYNC pins 144, BIT_CLK pins 146, SDATA_OUT pins 148, and RESET# pins 152 of audio codec controller 404, primary audio codec 100A, and secondary audio codecs 100B . . . 100L. Secondary audio codecs 100B . . . 100L are additionally coupled to audio codec controller 404 by connecting SDATA_IN pins 150 of secondary audio codecs 100B . . . 100L with respective SDATA_IN1 pin 150B, SDATA_IN2 pin 150C . . . SDATA_IN11 pin 150L of audio codec controller 404. In the configuration of FIG. 4B, clock generator system 102 of primary audio codec 100A utilizes the available clock signal within the circuit environment of audio codec 100A to provide the clock signal with the desired clock rate to drive primary audio codec 100A. Primary audio codec 100A provides from its BIT_CLK pin 146 a slave clock signal (e.g., BIT_CLK signal) at the slave-mode clock rate (e.g., BIT_CLK rate). BIT_CLK signal is fed into BIT_CLK pins 146 of secondary audio codecs 100B . . . 100L to drive secondary audio codecs 100B . . . 100L with the slave clock signal at the slave-mode clock rate. The slave clock signal is a fixed clock signal and is typically at a rate that is a fraction of the clock signal rate for primary audio codec 100A.

Referring now to FIG. 5, a table 500 shows exemplary combinatorial values assigned according to the present invention for clock present signal 207, ID0# pin 154, and ID1# pin 155 for defining which operational (or AC-link timing) mode (e.g., master or slave mode) audio codec 100 operates and which clock source drives audio codec 100. Audio codec 100 first determines whether the available clock signal within the circuit environment of audio codec 100 has a desired operational clock rate. For example, a typical desired clock rate for audio codes 100 is 24.576 MHz. A clock generator oscillator or a crystal generally provides the desired clock rate (e.g., 24.576 MHz) for audio codec 100.

If either clock generator oscillator or crystal is available and coupled to audio codec 100, then the values assigned to and inputted into ID0# pin 154 and ID1# pin 155 are both equal to one (1). When the clock generator oscillator is coupled to audio codec 100, the clock generator oscillator is powered on and the signal from the clock generator oscillator exists and is available to audio codec 100 during operation and even reset of audio codec 100. When the crystal is coupled to audio codec 100, the crystal is powered down or off during reset and before operation of audio codec 100 and the crystal signal does not exist and is not available during reset and before operation of audio codec 100. Therefore, in order to distinguish whether the clock generator oscillator or the crystal is coupled to audio codec 100 during reset, clock present signal 207 is assigned to be equal to one (1) when the clock generator oscillator is available and is assigned to be equal to zero (0) when the crystal is available.

When clock present signal 207, value for ID1# pin 155, and value for ID0# pin 154 are all equal to one (1), the clock generator oscillator is coupled to XTL_IN pin 140 and XTL_OUT pin 142 is left floating. The clock generator oscillator is the oscillator clock source that provides the available clock signal at the desired clock rate (e.g., 24.576 MHz) to audio codec 100. In this situation, audio codec 100 operates in the primary or master mode and is assigned a CODEC ID of zero (0) indicating that it is a master codec. Since the available clock signal is already at the desired clock rate and a conversion of clock rates is not necessary, then PLL circuit 221 is not activated. When clock present signal 207 is equal to zero (0) and values for ID1# pin 155 and ID0# pin 154 are both equal to one (1), the crystal is coupled between XTL_IN pin 140 and XTL_OUT pin 142. The crystal is the oscillator clock source that provides the available clock signal at the desired clock rate (e.g., 24.576 MHz) to audio codec 100. In this scenario, audio codec 100 still operates in the primary or master mode and is assigned a CODEC ID of zero (0) indicating that it is a master codec. Since the available clock signal is already at the desired clock rate and a conversion of clock rates is not necessary, then PLL circuit 221 is not activated.

Based on the exemplary values in table 500, when the values for ID1# pin 155 and ID0# pin 154 are not both equal to one, audio codec 100 determines that the available clock signal is not at the desired clock rate. Audio codes 100 next determines whether it is operating in a primary/master mode or a secondary/slave mode. The determination of operational mode is made by determining whether clock present signal 207 is equal to one (1) or zero (0). If values for ID1# pin 155 and ID0# pin 154 are not both equal to one and clock present signal 207 is equal to zero (0), then audio codes 100 is operating in the secondary/slave mode. Otherwise, if values for ID1# pin 155 and ID0# pin 154 are not both equal to one and clock present signal 207 is equal to one (1), then audio codec 100 is operating in the primary/master mode.

For example, in table 500, when clock present signal 207 equals zero (0) and values for ID1# pin 155 and ID0# pin 154 are not both equal to one (1), then audio codec 100 is operating in the secondary/slave mode. In this case, the clock source is not provided or generated from the available clock signal of audio codes 100, which is a slave codec. Instead, a master codec other than slave audio codec 100 drives the BIT_CLK signal as the clock source to BIT_CLK pin 146 of slave audio codec 100. BIT_CLK signal is a fixed clock signal that has a clock rate that is typically a fraction (e.g., a half) of the desired clock rate for a primary/master codec 100. A typical clock rate for a secondary/slave audio codec 100 would then be 12.288 MHz (e.g., half of 24.576 MHz). Also, when audio codec 100 is operating in the secondary/slave mode, PLL circuit 221 is not activated.

When audio codec 100 is operating in the secondary/slave mode, then the combination of values for ID1# pin 155 and ID0# pin 154 are utilized to provide an identifier for each secondary/slave codec 100. In table 500, when clock present signal 207 equals zero (0), value for ID1# pin 155 equals one (1), and value for ID0# pin 154 equals zero (0), slave audio codec 100 is assigned a CODEC ID of one (1) indicating that it is the first slave codec in relationship to the master codec. When clock present signal 207 equals zero (0), value for ID1# pin 155 equals zero (0) and value for ID0# pin 154 equals one (1), slave audio codec 100 is assigned a CODEC ID of two (2) indicating that it is the second slave codec in relationship to the master codec. When clock present signal 207 and values for ID1# pin 155 and ID0# pin 154 all equal zero (0), slave audio codec 100 is assigned a CODEC ID of three (3) indicating that it is the third slave codec in relationship to the master codec.

Also, when clock present signal 207 equals one (1) and values for ID1# pin 155 and ID0# pin 154 are not both equal to one (1), then audio codec 100 is operating in the primary/master mode. In this scenario, an external clock source is the oscillator clock source generating the available clock signal at a clock rate other than the desired clock rate. The available clock signal from the external clock source is utilized to generate a desired clock signal at the desired clock source. The external clock source drives XTL_IN pin 140, and loop filter 306 is coupled to XTL_OUT pin 142 as shown in FIG. 3.

FIG. 6 shows a table 600 with exemplary external clock sources and the values assigned to M divider 302 and N divider 312 of PLL circuit 221 that are used to generate the desired clock signal with the desired clock rate from the available clock signal. With reference now to both FIGS. 5 and 6, exemplary external clock sources that each provides the available clock signal utilized by audio codec 100 are now discussed. During configuration and prior to reset of audio codec 100, one of the exemplary clock sources is configured and set as the external clock source that provides the available clock signal for audio codec 100. When clock present signal 207 is equal to one (1), value for ID1# pin 155 is equal to one (1), and value for ID0# pin 154 is equal to zero (0), then an external clock source having a clock rate of 14.31818 MHz, such as a personal computer ("PC") system clock, is utilized to provide the available clock signal. The 14.31818 MHz clock rate is different from the desired clock rate of 24.576 MHz for audio codec 100. PLL circuit 221 is then configured to generate the desired clock rate of 24.576 MHz from the 14.31818 MHz clock rate. Value for M divider 302 is set at 201, and the value for N divider 312 is set at 345. The frequency of phase detector 304 is set at 71.2 kHz. When PLL circuit 221 is configured with these values, PLL circuit 221 outputs the desired output signal at the desired output rate of 24.576 MHz.

Also, when clock present signal 207 is equal to one (1), value for ID1# pin 155 is equal to zero (0), and value for ID0# pin 154 is equal to one (1), then an external clock source having a clock rate of 27 MHz, such as a video clock, provides the available clock signal. The 27 MHz clock rate is different from the desired clock rate of 24.576 MHz for audio codec 100. PLL circuit 221 is then configured to generate the desired clock rate of 24.576 MHz from the 27 MHz clock rate. Value for M divider 302 is set at 401, and the value for N divider 312 is set at 365. The frequency of phase detector 304 is set at 67.3 kHz. When PLL circuit 221 is configured with these values, PLL circuit 221 outputs the desired output signal at the desired output rate of 24.576 MHz.

Furthermore, when clock present signal 207 is equal to one (1), value for ID1# pin 155 is equal to zero (0), and value for ID0# pin 154 is equal to zero (0), then an external clock source having a clock rate of 48 MHz, such as an Universal Serial Bus ("USB") clock, provides the available clock signal. The 48 MHz clock rate is different from the desired clock rate of 24.576 MHz for audio codec 100. PLL circuit 221 is then configured to generate the desired clock rate of 24.576 MHz from the 48 MHz clock rate. Value for M divider 302 is set at 625, and the value for N divider 312 is set at 320. The frequency of phase detector 304 is set at 76.8 kHz. When PLL circuit 221 is configured with these values, PLL circuit 221 outputs the desired output signal at the desired output rate of 24.576 MHz. As a further example, a peripheral component interconnect ("PCI") bus clock having a clock rate of 33 MHz could instead be used as the external clock source to provide the available clock signal. In this case, the value for M divider 302 is set at 474, and the value for N divider 312 is set at 353. The frequency for phase detector 304 is set at 69.6 kHz. When PLL circuit 221 is configured with these values, PLL circuit 221 outputs the desired output signal at the desired output rate of 24.576 MHz.

Figure 7:
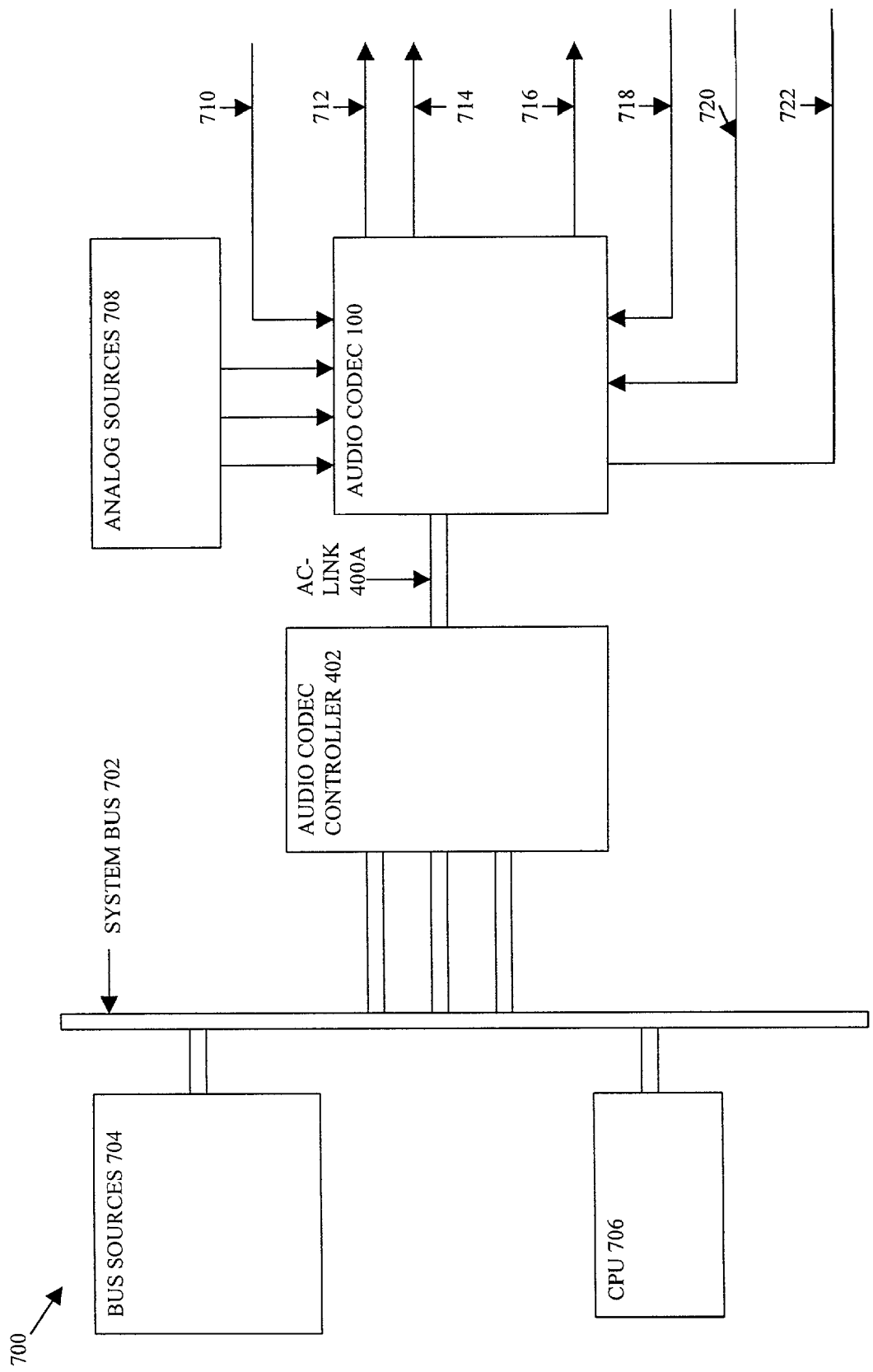
FIG. 7 is an exemplary block diagram of an audio system that implements the codec of FIG. 1 and the clock generator system of FIG. 2 according to the present invention.

Referring now to FIG. 7, an audio system 700 that implements audio codec 100 having clock generator system 102 according to the present invention is shown. Audio system 700 may be the audio sub-system for a personal computer or the audio system for a consumer set-top box, a portable audio device, a handheld computing device, or other devices with AC-link support. Audio system 700 includes audio codec controller 402 coupled to audio codec 100 through an AC-link 400A. Audio codec controller 402 is further coupled to a system bus 702, such as a peripheral component interconnect ("PCI") bus.

Bus sources 704 and a central processing unit ("CPU") 706 are coupled to system bus 702. Bus sources 704 include audio sources from audio applications, game applications, digital compact disk and digital video disk (CD/DVD) applications, soft MPEG, AC-3, and other such applications, and digital music (e.g., MP3) applications. Audio codec 100 receives analog signals from various analog sources 708. Exemplary analog sources 708 include Redbook audio signals from a CD/DVD player, video audio signals from a television tuner, and audio signals from an internal source through an auxiliary ("AUX") input. Audio codec 100 in FIG. 7 is configured to have the following exemplary inputs and outputs: LINE_IN signal 710, LINE_OUT signal 712, AUX_OUT signal 714, SPDIF_OUT signal 716, MIC_IN signal 718, PHONE signal 720, and MONO_OUT signal 722.

LINE_IN signal 710 is an analog input signal from an auxiliary external audio source to input mixer 122. LINE_OUT signal 712 is an analog output from output mixer 126. AUX_OUT signal 714 is an analog output from output mixer 126 for an auxiliary device. Exemplary AUX_OUT signal 714 included but are not limited to a line level output ("LNLVL_OUT") signal, a headphone output ("HP_OUT") signal, or a 4-channel output ("4CH_OUT") signal. SPDIF_OUT signal 716 is a S/PDIF digital output from audio codes 100 that may be used to directly drive a resistive divider and coupling transformer to an RCA-type connector for use with consumer audio equipment. MIC_IN signal 718 is an analog input from a microphone that provides a monophonic source to input mixer 122. PHONE signal 720 is an analog input from a telephony device that provides a monophonic source to output mixer 126. MONO_OUT signal 722 is an analog output from a stereo-to-mono mixer.

Audio codec 100 in audio system 700 performs DAC and ADC conversions and mixing functions and provides analog input/output ("I/O") capabilities for audio or modem signals. Audio codec 100 operates as a slave device to audio codec controller 402, which is typically either a discrete PCI accelerator or a controller that is integrated within a core logic chipset. AC-link 400A is a digital link that is in a bi-directional, 5-wire serial Time Division Multiplexing ("TDM") format interface. AC-link 400A typically supports connections between a single audio codec controller 402 and up to four audio codecs 100 on a circuit board or riser card.

Audio system 700 provides various audio output options, such as analog stereo output, amplified analog stereo headphone output, discrete analog 4-channel output, analog matrix-encoded surround output, and digital 5.1 channel output. Analog stereo output is a LINE_OUT signal 712 that is transmitted to amplified stereo PC speaker array via a stereo mini-jack. Amplified analog stereo headphone output is a HP_OUT signal (e.g., AUX_OUT signal 714) transmitted to a headphone or headset through a stereo mini-jack. Discrete analog 4-channel output are a LINE_OUT signal 712 and a 4CH_OUT signal (e.g., AUX_OUT signal 714) that are transmitted to front and surround amplified speaker arrays via dual stereo mini-jacks. Analog matrix-encoded surround output, such as Dolby ProLogic, is a LNLVL_OUT signal (e.g., AUX_OUT signal 714) to consumer audio/video ("A/V") equipment that drives a home-theater multi-speaker array. Digital 5.1 channel output, such as Dolby Digital AC-3 is a SPDIF_OUT signal 716 that is transmitted via S/PDIF interface to digital ready consumer A/V equipment which drives a home-theater multi-speaker array.

Figure 8:
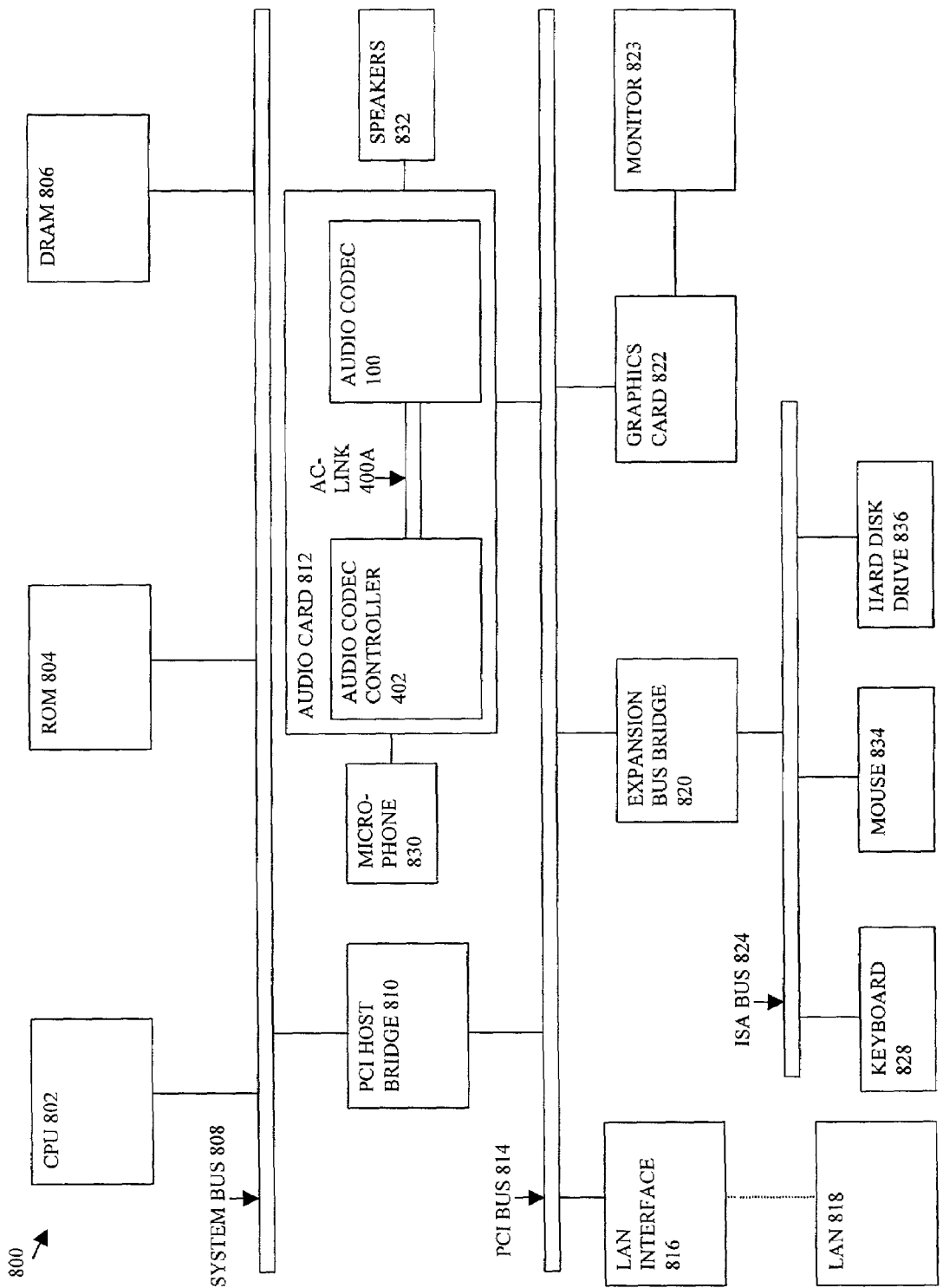
FIG. 8 is an exemplary block diagram of a computer system that has an audio card comprising and implementing the codec of FIG. 1 according to the present invention.

With reference now to FIG. 8, a typical computer system 800, which may be utilized in conjunction with a preferred embodiment of the present invention, is depicted. As shown, a central processing unit ("CPU") 802, a read only memory ("ROM") 804, a dynamic random access memory ("DRAM") 806 are connected to a system bus 808 of computer system 800. CPU 802, ROM 804, and DRAM 806 are also coupled to a PCI local bus 814 of computer system 800 through a PCI host bridge 810. PCI host bridge 810 provides a low latency path through which CPU 802 may directly access PCI devices mapped anywhere within bus memory and/or input/output ("I/O") address spaces. PCI host bridge 810 also provides a high bandwidth path allowing PCI devices to directly access DRAM 806.

In addition, an audio card 812 is attached to PCI local bus 814 for receiving audio input, such as from a microphone 830, and controlling audio output to speakers 832. Audio card 812 contains audio codec 100 with clock generator system 102 according to the present invention, and audio codec 100 is coupled to audio codec controller 402 via AC-link 400A. A graphics card 822 is attached to PCI local bus 814 for controlling visual output to a monitor 823. A local area network ("LAN") interface adapter 816 is coupled to PCI local bus 814. LAN interface adapter 816 is utilized for connecting computer system 800 to a LAN 818. A PCI-to-Industry Standard Architecture ("ISA") bus bridge, such as expansion bus bridge 820, may be utilized for coupling an ISA bus 824 to PCI local bus 814. A keyboard 828, a mouse 834, and a hard disk drive 836 are attached to ISA bus 824 for performing basic I/O functions. Although the illustrated exemplary embodiment describes a PCI local bus 814 and an ISA bus 824, the present invention is not limited to the particular bus architectures. Rather, the present invention can be utilized in any bus system having other bus architectures.

In summary, the present invention discloses a clock generator system 102 and method for providing and operating audio codec 100 with a clock signal at a desired operational rate. Clock generator system 102 also has PLL circuit 221. Clock generator system 102 determines whether an available clock signal within a circuit environment of audio codec 100 has a desired clock rate. If the available clock signal has the desired clock rate, clock generator system 102 supplies and operates audio codec 100 with the available clock signal. If the available clock signal does not have the desired clock rate, PLL circuit 221 generates from the available clock signal a desired clock signal having the desired clock rate and supplies and operates audio codec 100 with the desired clock signal.

The present invention eliminates the need of having to use a separate clock, such as a clock generating oscillator or a crystal for a codec. The elimination of a separate clock reduces the overall size and cost for the codec. The present invention utilizes an available clock signal that is not at the desired rate and generates a desired clock signal at the desired rate. The present invention provides a scheme in which the use of extra pins or additional memory is/are not required.

While the invention has been particularly shown and described with reference to a preferred embodiment, it will be understood by those skilled in the art that various changes in form and detail may be made therein without departing from the spirit and scope of the invention.

The invention claimed is:

1. A method for providing and operating a codec with a clock signal at a desired operational rate, comprising:
   determining whether an available clock signal within a circuit environment of a codec has a desired clock rate;
   in response to the available clock signal having the desired clock rate, supplying and operating the codec with the available clock signal; and
   in response to the available clock signal not having the desired clock rate, generating from the available clock signal, by a phase-locked loop circuit, a desired clock signal having the desired clock rate and supplying and operating the codec with the desired clock signal wherein the available clock signal is a signal from one of various clock sources;
   utilizing combinatorial values of a clock-present signal, an identification signal, and another identification signal to determine which one of the various clock sources provides the available clock signal;
   setting the clock-present signal to a high value when a clock generator oscillator source signal or an external clock source signal is detected during a reset period of the codec; and
   otherwise setting the clock-present signal to a low value.

2. The method according to claim 1, wherein the various clock sources include at least a clock generator source, an external clock source, and a crystal.

3. The method according to claim 2, wherein the external clock source is either a system clock, a video clock, or a bus clock.

4. The method according to claim 3, wherein the step of utilizing combinatorial values further comprises:
   detecting a first set of values for the identification signal and the another identification signal that indicates first using either the clock generator source or the crystal as the available clock signal depending upon the value of the clock-present signal; and
   in response to the first set of values for the identification signal and the another identification signal not being detected, detecting a second set of values for the identification signal and the another identification signal that indicates then using the external clock as the available clock signal.

5. The method according to claim 2, wherein:
   the step of setting the clock-present signal to a high value further comprises setting the clock-present signal to the high value when either the clock generator oscillator source signal or the external clock source signal is driven to the codec; and
   the step of otherwise setting the clock-present signal to a low value further comprises setting the clock-present signal to the low value either when the crystal, which is powered-down before operation of the codec, is coupled to the codec or when the codec is operating in a slave mode.

6. The method according to claim 1, further comprising the step of:
   driving the codec with a fixed clock signal instead of the available clock signal if the codec is operating in a slave mode.

7. The method according to claim 1, wherein the phase-locked loop circuit further comprises:
   an M divider, a phase detector and charge pump stage, a loop filter, a transconductance and current controlled oscillator stage, and an integrator coupled in series, and an N divider coupled in a feedback loop between an output of the integrator and an input of the phase detector and charge pump stage, and further comprising the step of:
   during configuration and before operation of the codec, adjusting values of the M divider and the N divider based on a rate of the available clock signal from which the phase-locked loop circuit needs to generate the desired clock rate and wherein M and N are defined as integers.

8. The method according to claim 1, wherein operating the codec at the desired clock rate enables the codec to maintain a desired sample rate.

9. A clock generator system for providing and operating a codec with a clock signal at a desired operational rate, comprising:
   a desired clock-rate processing circuit and a clock-rate switching system coupled together in series and an output of the clock-rate switching system coupled to inputs of both an analog clock generator and a digital clock generator and an output of the digital clock generator coupled to a codec;
   a phase-locked loop circuit coupled in a feedback loop between the desired clock-rate processing circuit and the clock-rate switching system;
   wherein the desired clock-rate processing circuit determines whether an available clock signal within a circuit environment of the codec has a desired clock rate;
   wherein in response to the available clock signal having the desired clock rate, the clock-rate switching system directs the digital clock generator to supply and operate the codec with the available clock signal; and
   wherein in response to the available clock signal not having the desired clock rate, the clock-rate switching system activates the phase-locked loop circuit and the phase-locked loop circuit generates from the available clock signal a desired clock signal having the desired clock rate and the digital clock generator supplies and operates the codec with the desired clock signal.

10. The clock generator system according to claim 9, wherein the available clock signal is a signal from one of various clock sources.

11. The clock generator system according to claim 10:
    wherein the desired clock-rate processing system generates a clock-present signal that is utilized to determine which one of the various clock sources provides the available clock signal;
    wherein the clock-present signal is set to a high value when a clock generator oscillator source signal or an external clock source signal is detected during a reset period of the codec; and
    wherein the clock-present signal is otherwise set to a low value.

12. The clock generator system according to claim 11, wherein the various clock sources include at least a clock generator source, an external clock source, and a crystal.

13. The clock generator system according to claim 11, wherein the desired clock-rate processing circuit further comprises:
    a super hysterisis circuit and a clock-off detector coupled together in series and used to determine when the clock-present signal is set to the low value.

14. The clock generator system according to claim 9, wherein the phase-locked loop circuit further comprises:
    an M divider, a phase detector and charge pump stage, a loop filter, a transconductance and current controlled oscillator stage, and an integrator coupled in series, and an N divider coupled in a feedback loop between an output of the integrator and an input of the phase detector and charge pump stage, and wherein during configuration and before operation of the codec, values of the M divider and the N divider are adjusted based on a rate of the available clock signal from which the phase-locked loop circuit needs to generate the desired clock rate and wherein M and N are defined as integers.

15. The clock generator system according to claim 9, wherein a fixed clock signal is used to drive the codec instead of the available clock signal if the codec is operating in a slave mode.

16. The clock generator system according to claim 15, further comprising:

a mode switching system coupled before the input of the analog clock generator and the input of the digital clock generator wherein the mode switching system switches between providing the signal with the desired clock rate to the codec when the codec is operating in a master mode and providing the fixed clock signal to the codec when the codec is operating in the slave mode.

17. A codec for coding and decoding signals, comprising:

a clock generator system having a phase-locked loop circuit wherein the clock generator system determines whether an available clock signal within a circuit environment of the codec has a desired clock rate and in response to the available clock signal having the desired clock rate, supplies and operates the codec with the available clock signal, and in response to the available clock signal not having the desired clock rate, generates, by a phase-locked loop circuit, from the available clock signal a desired clock signal having the desired clock rate and supplies and operates the codec with the desired clock signal wherein the available clock signal is a signal from one of various clock sources and wherein the clock generator system utilizes combinatorial values of a clock-present signal, an identification signal, and another identification signal to determine which one of the various clock sources provides the available clock signal and wherein the clock-present signal is set to a high value when a clock generator oscillator source signal or an external clock source signal is detected during a reset period of the codec, and wherein the clock-present signal is otherwise set to a low value;

a digital interface block having at least registers and a codec link interface for coupling to a codec controller wherein the clock generator system is coupled to the digital interface block;

a digital input/output interface block for digitally interfacing with input and output devices wherein the digital input/output interface block is coupled to the digital interface block;

an analog interface block having at least an analog-to-digital converter, an input multiplexer, an input mixer, an output mixer, and a digital-to-analog converter wherein the analog interface block is coupled to the digital interface block; and a sample rate conversion system coupled between the digital interface block and the analog interface block to convert between respective sample rates of the digital interface block and the analog interface block.

18. The codec according to claim 17, wherein the various clock sources include at least a clock generator source, an external clock source, and a crystal.

19. The codec according to claim 17, wherein the phase-locked loop circuit further comprises:

an M divider, a phase detector and charge pump stage, a loop filter, a transconductance and current controlled oscillator stage, and an integrator coupled in series, and an N divider coupled in a feedback loop between an output of the integrator and an input of the phase detector and charge pump stage, and wherein during configuration and before operation of the codec, values of the M divider and the N divider are adjusted based on a rate of the available clock signal from which the phase-locked loop circuit needs to generate the desired clock rate and where in M and N are defined as integers.

20. The codec according to claim 17, wherein a fixed clock signal is used to drive the codec instead of the available clock signal if the codec is operating in a slave mode.

21. An audio system, comprising:

an audio codec that receives signals from analog sources and that includes:

a clock generator system that determines whether an available clock signal within a circuit environment of the codec has a desired clock rate and in response to the available clock signal having the desired clock rate, supplies and operates the codec with the available clock signal, and in response to the available clock signal not having the desired clock rate, generates, by a phase-locked loop circuit, from the available clock signal a desired clock signal having the desired clock rate and supplies and operates the codec with the desired clock signal wherein the available clock signal is a signal from one of various clock sources and wherein the clock generator system utilizes combinatorial values of a clock-present signal, an identification signal, and another identification signal to determine which one of the various clock sources provides the available clock signal and wherein the clock-present signal is set to a high value when a clock generator oscillator source signal or an external clock source signal is detected during a reset period of the codec and wherein the clock-present signal is otherwise set to a low value;

a digital interface block having at least registers and a codec link interface for coupling to a codec controller wherein the clock generator system is coupled to the digital interface block;

a digital input/output interface block for digitally interfacing with input and output devices wherein the digital input/output interface block is coupled to the digital interface block;

an analog interface block having at least an analog-to-digital converter, an input multiplexer, an input mixer, an output mixer, and a digital-to-analog converter wherein the analog interface block is coupled to the digital interface block; and a sample rate conversion system coupled between the digital interface block and the analog interface block to convert between respective sample rates of the digital interface block and the analog interface block;

an audio codec link coupled to the audio codec;

an audio codec controller coupled to the audio codec link wherein the audio codec controller controls operation of the audio codec;

a system bus coupled to the audio codec controller; and a central processing unit and bus sources coupled to the system bus.

22. The audio system according to claim 21, wherein the various clock sources include at least a clock generator source, an external clock source, and a crystal.

23. The audio system according to claim 21, wherein the phase-locked loop circuit further comprises:
- an M divider, a phase detector and charge pump stage, a loop filter, a transconductance and current controlled oscillator stage, and an integrator coupled in series, and
- an N divider coupled in a feedback loop between an output of the integrator and an input of the phase detector and charge pump stage, and
- wherein during configuration and before operation of the codec, values of the M divider and the N divider are adjusted based on a rate of the available clock signal from which the phase-locked loop circuit needs to generate the desired clock rate and wherein M and N are defined as integers.

24. The audio system according to claim 21, wherein a fixed clock signal is used to drive the codec instead of the available clock signal if the codec is operating in a slave mode.

25. The audio system according to claim 21, wherein the audio system is an audio card for a computer; and further comprising a memory system coupled to the system bus.

* * * * *